(12) United States Patent
Saijo et al.

(10) Patent No.: US 7,183,190 B2
(45) Date of Patent: *Feb. 27, 2007

(54) SEMICONDUCTOR DEVICE AND FABRICATION METHOD THEREFOR

(75) Inventors: Kinji Saijo, Yamaguchi-ken (JP); Shingji Ohsawa, Yamaguchi-ken (JP); Hiroaki Okamoto, Yamaguchi-ken (JP); Kazuo Yoshida, Yamaguchi-ken (JP); Tadatomo Suga, 1296-1, Higashitoyoi, Kudamatsu-shi, Yamaguchi-ken (JP) 744-8611

(73) Assignees: Toyo Kohan Co., Ltd., Tokyo (JP); Tadatomo Suga, Tokyo (JP)

( * ) Notice: Subject to any disclaimer, the term of this patent is extended or adjusted under 35 U.S.C. 154(b) by 326 days.

This patent is subject to a terminal disclaimer.

(21) Appl. No.: 10/258,062

(22) PCT Filed: Mar. 27, 2001

(86) PCT No.: PCT/JP01/02437

§ 371 (c)(1),
(2), (4) Date: Feb. 28, 2003

(87) PCT Pub. No.: WO01/80299

PCT Pub. Date: Oct. 25, 2001

(65) Prior Publication Data

US 2003/0155662 A1    Aug. 21, 2003

(30) Foreign Application Priority Data

Apr. 19, 2000  (JP) ............................... 2000-118227

(51) Int. Cl.
*H01L 21/44* (2006.01)

(52) U.S. Cl. ...................... 438/613; 438/614; 438/740

(58) Field of Classification Search ................ 257/780, 257/781; 438/613, 614, 690, 691, 692, 700, 438/717, 720, 740

See application file for complete search history.

(56) References Cited

U.S. PATENT DOCUMENTS

| | | | | |
|---|---|---|---|---|
| 4,380,114 A | * | 4/1983 | Webb | .......................... 438/109 |
| 5,426,850 A | * | 6/1995 | Fukutomi et al. | ............. 29/848 |
| 5,677,576 A | * | 10/1997 | Akagawa | |
| 5,994,783 A | * | 11/1999 | You | ........................... 257/778 |
| 6,365,432 B1 | * | 4/2002 | Fukutomi et al. | ........... 438/106 |
| 6,451,441 B1 | * | 9/2002 | Nishimoto et al. | ......... 428/461 |

(Continued)

OTHER PUBLICATIONS

DialogIP Document; Manufacture of Semiconductor Device; Abstract of JP 200243774 A; Sep. 8, 2000; Sanyo Electric Co Ltd.

(Continued)

*Primary Examiner*—S. V. Clark
(74) *Attorney, Agent, or Firm*—Browdy and Neimark, PLLC (57) ABSTRACT

A method of efficiently and inexpensively fabricating a chip-size package having an electrode pitch expanded by forming a conductor wiring on the electrode forming surface side of a semiconductor chip, especially, a method for facilitating wiring and bump forming. A semiconductor device comprising a semi-conductor elements and conductor wirings formed on the semiconductor elements by etching wiring-forming metal foil; and a fabrication method for a semiconductor device comprising the steps of laminating wiring forming metal foil on the electrode forming surface side on the semiconductor, forming a resist wiring pattern on the metal foil, etching the metal foil, and slicing the device into individual elements.

1 Claim, 7 Drawing Sheets

U.S. PATENT DOCUMENTS

| | | | |
|---|---|---|---|
| 6,472,745 B1 * | 10/2002 | Iizuka | |
| 6,483,195 B1 * | 11/2002 | Aoki et al. | 257/778 |
| 6,525,921 B1 * | 2/2003 | Nakatani et al. | 361/306.3 |
| 6,663,980 B1 * | 12/2003 | Saijo et al. | 428/607 |
| 6,717,819 B1 * | 4/2004 | Chung | 361/760 |
| 6,841,877 B2 * | 1/2005 | Saijo et al. | 257/750 |
| 6,861,284 B2 * | 3/2005 | Higashi et al. | 438/107 |
| 6,869,750 B2 * | 3/2005 | Zhang et al. | 430/312 |
| 6,900,646 B2 * | 5/2005 | Kasukabe et al. | 324/754 |
| 2003/0141596 A1 * | 7/2003 | Nakamura et al. | 257/758 |

OTHER PUBLICATIONS

DialogIP Document; Semiconductor Device and its Manufacturing Method; Abstract of JP 2001093905 A; Apr. 6, 2001; Fujitsu Quantum Devices Ltd.

DialogIP Document; Semiconductor Device and its Manufacturing Method; Abstract of JP 2001093928 A; Apr. 6, 2001; Toshiba Corp.

* cited by examiner

SEMICONDUCTOR DEVICE AND FABRICATION METHOD THEREFOR

TECHNICAL FIELD

This invention concerns a chip-size semiconductor device formed with conductor wirings for re-arranging electrodes on an IC chip and it, particularly, relates to a fabrication method capable of collective processing at the wafers.

BACKGROUND ART

In recent years, size-reduction, enhancement for function, higher integration degree and multiple pin arrangement have been progressed remarkably for IC package. Further, CSP as a package of a size identical with a chip-size has been developed recently.

JP-A-11-121507 proposes a method of packaging in a state of wafer and fabricating a chip-size package. However, in this method, bumps for connecting an IC package with the outside are formed at electrode positions in IC. In recent tend for the reduction of chip-size and multiple pin arrangement, the pitch for arranging electrodes of the chip has been narrowed more and more and it is necessary to re-arrange the electrodes on the IC chip to expand the electrode pitch for facilitating subsequent mounting.

This invention intends to solve the foregoing problems in the prior art and provide a method of fabricating a chip-size package in which the electrode pitch is extended by forming conductor wirings on the side of the electrode forming surface of a semiconductor element efficiently and at a reduced cost and, particularly, to provide a method capable of forming wirings and bumps easily.

DISCLOSURE OF THE INVENTION

The present inventors have found that the foregoing object can be solved by laminating a wiring-forming metal foil on the side of forming electrodes of a semiconductor wafer formed at the surface thereof with circuit elements by using a bonding technique between a metal foil and ceramics previously filed by the present inventors (refer to International Publication No. WO99/58470), and then etching the metal foil to form wirings and dividing the same into individual elements.

Further, it has been found for the formation of bumps that bumps can be formed by laminating a wiring-forming multi-layered metal foil to a semiconductor wafer formed at the surface thereof with circuit elements on the side of the electrode forming surface and by merely etching the wirings having bumps thereon.

That is, this invention described in claim 1 provides a semiconductor device comprising a semiconductor element and conductor wirings on the semiconductor element formed by etching a wiring-forming metal foil (hereinafter referred to as a first embodiment of this invention).

In this case, it is preferred that the wiring-forming metal foil is copper.

Further in this case, the thickness of the wiring-forming metal foil is preferably 1 to 100 μm.

The semiconductor device of the first embodiment according to this invention described above is obtained by a step of laminating a wiring-forming metal foil to a semiconductor wafer formed at the surface thereof with circuit elements on the electrode forming surface side, a step of forming a resist wiring pattern on the metal foil, a step of etching the metal foil and a step of dividing into individual elements.

In this case, it is preferred that the wiring-forming metal foil is copper.

Further in this case, it is preferred that the thickness of the wiring-forming metal foil is 1 to 100 μm.

Further in this case, it is preferred that the semiconductor wafer formed at the surface thereof with circuit elements is a semiconductor wafer formed at the surface thereof with a metal thin film.

Further, another embodiment of the invention provides a semiconductor device comprising a semiconductor element, conductor wirings formed on the semiconductor element formed by etching a wiring-forming metal foil and solder bumps (hereinafter referred to as a second embodiment of this invention).

In this case, it is preferred that the wiring-forming metal foil is copper.

Further in this case, it is preferred that the thickness of the wiring-forming metal foil is 1 to 100 μm.

The semiconductor device according to the second embodiment of this invention is obtained by a step of laminating a wiring-forming metal foil to the semiconductor wafer formed at the surface thereof with circuit elements on the electrode forming surface side, a step of forming a resist wiring pattern on the metal foil, a step of etching the metal foil, a step of forming solder bumps and a step of dividing into individual elements.

In this case, it is preferred that the wiring-forming metal foil is copper.

Further in this case, it is preferred the thickness of the wiring-forming metal foil is 1 to 100 μm.

Further, in this case, it is preferred that the semiconductor wafer formed at the surface thereof with circuit elements is a semiconductor wafer formed at the surface thereof with a metal thin film.

Further, another embodiment of the invention provides a semiconductor device comprising a semiconductor element and a conductor wiring having bumps on the semiconductor element (hereinafter referred to as a third embodiment of this invention).

In this case, it is desirable that the wiring-forming multi-layered metal foil is a metal laminate comprising three layers of bump-forming copper or solder foil/etching stopper layer nickel/wiring-forming copper foil and, further, it is preferred the thickness of the bump forming copper or solder foil is from 10 to 100 μm. Further, the etching stopper layer nickel is preferably nickel plating of 0.5 to 3 μm thickness or nickel foil clad of 1 to 10 μm thickness.

Further, in this case, it is preferred that the thickness of the wiring-forming copper foil is 1 to 100 μm.

The semiconductor device of the third embodiment according to this invention as described above can be fabricated by a method of fabricating a semiconductor device including a step of laminating a wiring-forming multi-layer metal foil to a semiconductor wafer formed at the surface thereof with circuit elements on the electrode forming surface side, a step of forming a bump-forming resist wiring pattern on the multi-layered metal foil, a step of selectively etching the metal foil, a step of removing the etching stopper layer, a step of forming a wiring-forming resist wiring pattern and a step of forming wirings by etching, and a step of dividing into individual elements.

In the fabrication method of the semiconductor device, it is preferred that the wiring-forming multi-layered metal foil is a metal laminate comprising three layers of a bump forming copper or solder foil/etching stopper layer nickel/ wiring forming copper foil. Further, it is preferred that the thickness of the bump-forming copper or soldering foil is 10 to 100 μm. Further, the etching stopper layer nickel is preferably nickel plating of 0.5 to 3 μm thickness or nickel foil clad of 1 to 10 μm thickness. Further, it is preferred that the thickness of the wiring-forming copper foil is 1 to 100 μm.

Further, in the method of fabricating the semiconductor device, the semiconductor wafer formed at the surface thereof with circuit elements is preferably a semiconductor wafer formed at the surface thereof with a thin metal film.

The semiconductor device according to this invention comprises a semiconductor element, a conductor wiring having bumps on the semiconductor element formed by etching a wiring-forming multi-layered metal foil, an insulative resin and solder bumps.

The method of fabricating the semiconductor device according to this invention includes a step of laminating a wiring-forming multi-layered metal foil to the semiconductor wafer formed at the surface thereof with circuit elements on the electrode forming surface side, a step of forming a bump-forming resist wiring pattern on the multi-layered metal foil, a step of selectively etching the metal foil, a step of removing the etching stopper layer, a step of forming wiring-forming resist wiring pattern, and a step of forming wirings by etching, a step of coating an insulative resin and polishing the surface thereof, a step of forming solder bumps and a step of dividing into individual elements.

BEST MODE FOR PRACTICING THE INVENTION

At first, a first embodiment according to this invention is to be described.

The first embodiment according to this invention concerns a semiconductor device comprising a semiconductor wafer formed at the surface thereof with circuit elements, and conductor wirings on the semiconductor element formed by etching a wiring-forming metal foil.

As the semiconductor, a semiconductor wafer or the like used ordinarily can be used and, as the wiring-forming metal foil, a foil preferably formed of copper with a thickness of 1 to 100 μm can be used. The conductor wirings can be formed appropriately into a desired shape.

The semiconductor device in the first embodiment according to this invention can be fabricated by a method of fabricating a semiconductor device including a step of laminating a wiring-forming metal foil to a semiconductor wafer formed at the surface thereof with circuit elements on the electrode-forming surface side, a step of forming a resist wiring pattern on the metal foil, a step of etching the metal foil and a step of dividing into individual elements.

As the substrate, those used ordinarily such as a semiconductor wafer formed at the surface thereof with circuit elements can be used. As the wiring-forming metal foil, a foil preferably formed of copper and of 1 to 100 μm thickness can be used as described above.

Depending on the case, a thin metal film can be provided on the semiconductor wafer formed at the surface thereof with circuit elements by using a sputtering method, a vapor deposition method or the like after surface cleaning. This can facilitate lamination of the metal foil on the semiconductor wafer. As the metal forming the thin film, Cr, Mo, W or the like is used as a barrier metal in a case where the chip electrode of the semiconductor is Al, but the subsequent removal by etching is difficult. Then, with a view point for the ease of etching elimination, use of nickel is preferred.

Figure 1:
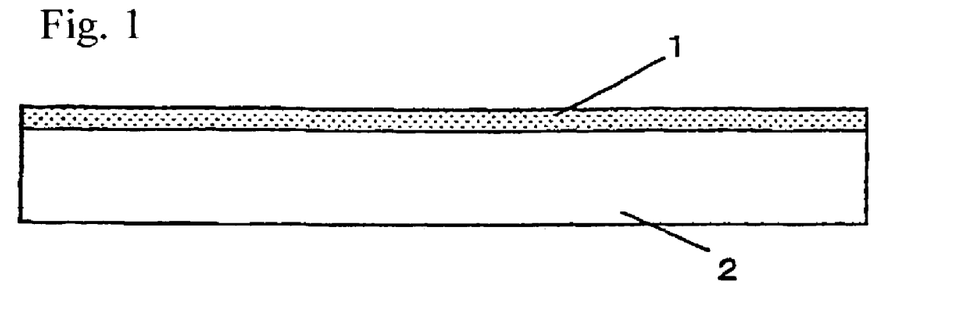
FIG. 1 is a view showing an example of a circuit forming step for a first embodiment and a second embodiment according to this invention (step of laminating a wiring copper foil on a semiconductor wafer).

Lamination of the wiring-forming metal foil to the semiconductor wafer can be conducted by using the technique described in International Publication No. WO99/58470 previously filed by the present inventors (FIG. 1).

After lamination, a resist is coated on the wiring forming metal foil and then exposure and development are conducted to form a resist wiring pattern. The resist wiring pattern is formed preferably such that it can be easily divided subsequently into individual elements and it can adopt, for example, a method of not coating the resist to portions for the division.

A series of procedures such as resist coating, exposure and development can be conducted based on the ordinary method.

Then, the wiring-forming metal foil is etched. In a case where the metal foil is copper, a commercially available alkali type copper etching solution can be used as the etching solution.

Figure 2:
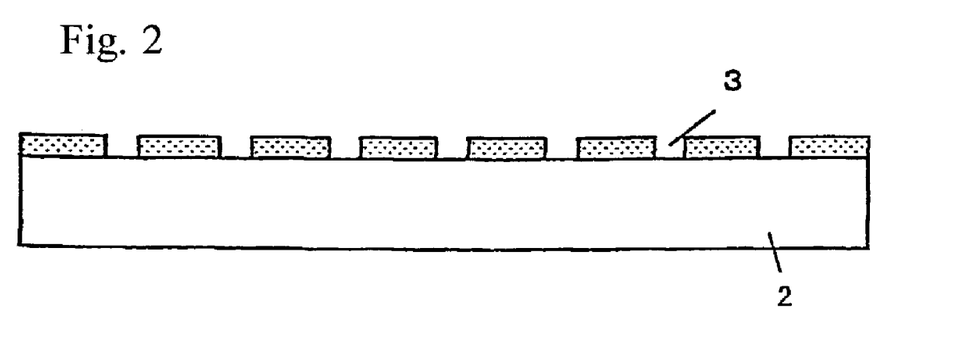
FIG. 2 is a view showing an example of a circuit forming step in a first embodiment and a second embodiment according to this invention (step of forming conductor wirings on the wiring copper foil).

Successively, the resist is removed to form wirings (FIG. 2).

Figure 3:
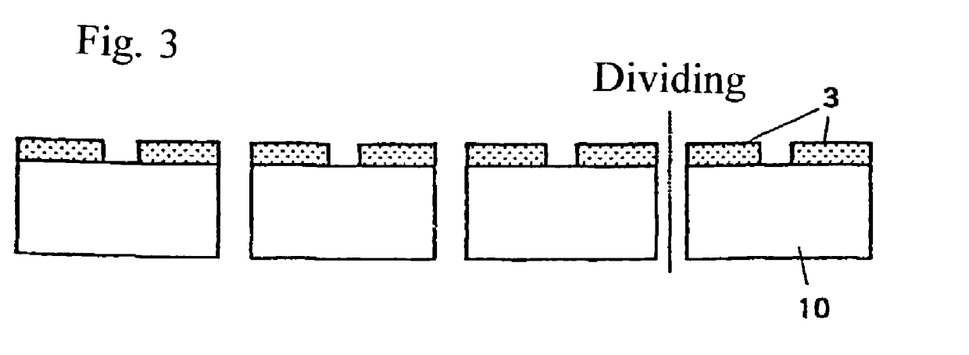
FIG. 3 is a view showing an example of a circuit forming step in the first embodiment according to this invention (step of cutting into individual elements).
Figure 4:
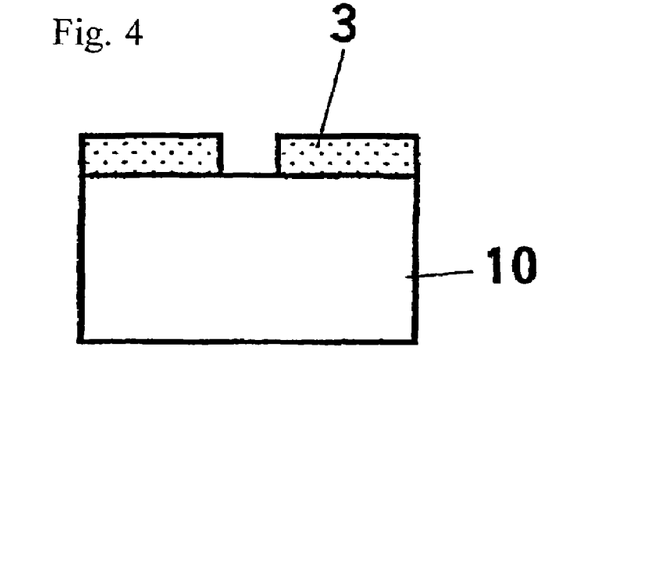
FIG. 4 is a view showing an example of a circuit forming step in the first embodiment according to this invention (element after cutting).

Finally, it is divided into individual elements that is, as described above, in a case where the portions for the division formed upon resist wiring pattern formation for indicating the boundary between each of individual element regions are made distinct, it is divided into individual elements with reference to the portions (FIGS. 3, 4).

Division is conducted by using a diamond blade, laser or the like.

At first, a second embodiment of this invention is to be described.

The second embodiment of this invention concerns a semiconductor device comprising a semiconductor element, conductor wirings on the semiconductor element formed by etching a wire-forming metal foil and solder bumps.

The semiconductor, the wiring-forming metal foil and the conductor wirings are identical with those described for the first embodiment of this invention.

The semiconductor device described above can be fabricated by a method of fabricating a semiconductor device including a step of laminating a wiring-forming metal foil to a semiconductor wafer formed at the surface thereof with circuit elements on the electrode forming surface side, a step of forming a resist wiring pattern on the metal foil, a step of etching the metal foil, a step of forming solder bumps and a step of dividing into individual elements.

As the substrate, a semiconductor wafer formed at the surface thereof with circuit elements can be used usually and, depending on the case, a thin metal film can be provided after surface cleaning of the semiconductor wafer or the like. Further, lamination of the wiring-forming metal foil to the semiconductor wafer can be conducted in the same manner as in the first embodiment of this invention, by using the technique described in International Publication No. WO99/58470 previously filed by the present inventors (FIG. 1).

After the lamination, like the first embodiment of this invention, a resist is coated on the wiring-forming metal foil and then exposure and development are conducted to form a resist wiring pattern and, successively, the wiring-forming metal foil is etched and then the resist is removed to form wirings (FIG. 2). The resist wiring pattern is preferably applied so as to be divided easily into individual elements subsequently like the first embodiment.

Figure 5:
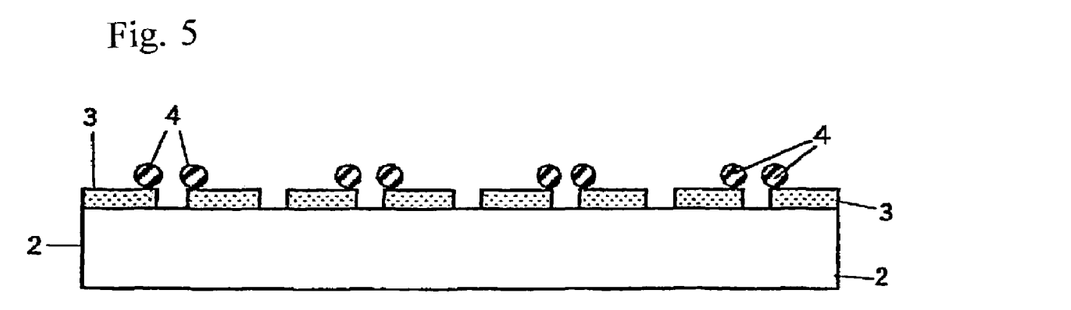
FIG. 5 is a view showing an example of a circuit forming step in the second embodiment according to this invention (step of forming solder bumps on wiring copper foil).

In the second embodiment of this invention, solder bumps are successively formed (FIG. 5). The solder bumps are formed at the positions for re-arranging electrodes.

Figure 6:
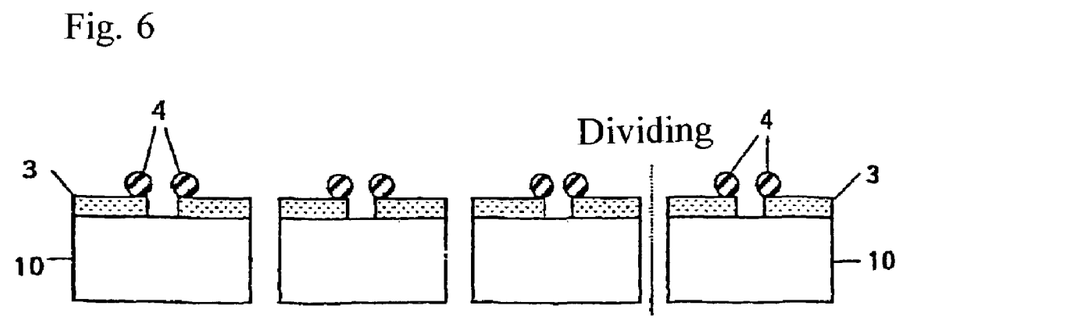
FIG. 6 is a view showing an example of a circuit forming step in the second embodiment according to this invention (step of cutting into individual elements).
Figure 7:
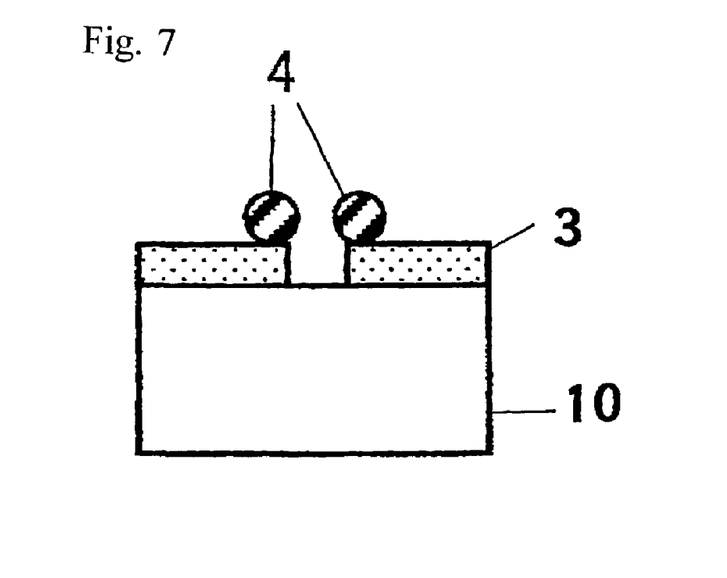
FIG. 7 is a view showing an example of a circuit forming step in the second embodiment according to this invention (element after cutting).

Finally, it is divided into individual elements (FIGS. 6, 7). Division is identical with that in the first embodiment of this invention.

Successively, a third embodiment according to this invention is to be explained.

The third embodiment of this invention concerns a semiconductor device comprising a semiconductor element, and conductor wirings having bumps on the semiconductor element formed by etching the wiring-forming multi-layered metal foil.

The semiconductor device, the wiring-forming metal foil and the conductor wirings are identical with those described for the first embodiment and the second embodiment of this invention.

The thickness of the conductor wirings is 1 to 100 μm as described above, and for the etching stopper layer, nickel plating of 0.5 to 3 μm thickness, preferably, 1 to 2 μm thickness or nickel foil clad of 1 to 10 μm thickness, preferably, 2 to 5 μm thickness can be used.

The thickness of the bump is 10 to 100 μm, preferably, 10 to 50 μm.

The semiconductor device according to the third embodiment of this invention described above can be fabricated by a method of fabricating a semiconductor device including a step of laminating a wiring-forming multi-layered metal foil to a semiconductor formed at the surface thereof with circuit elements on the electrode forming surface side, a step of forming a bump-forming resist wiring pattern on the multi-layered metal foil, a step of selectively etching the metal foil, a step of removing the etching stopper layer, a step of forming a wiring-forming resist wiring pattern and a step of forming wirings by etching, and a step of dividing into individual elements.

Figure 8:
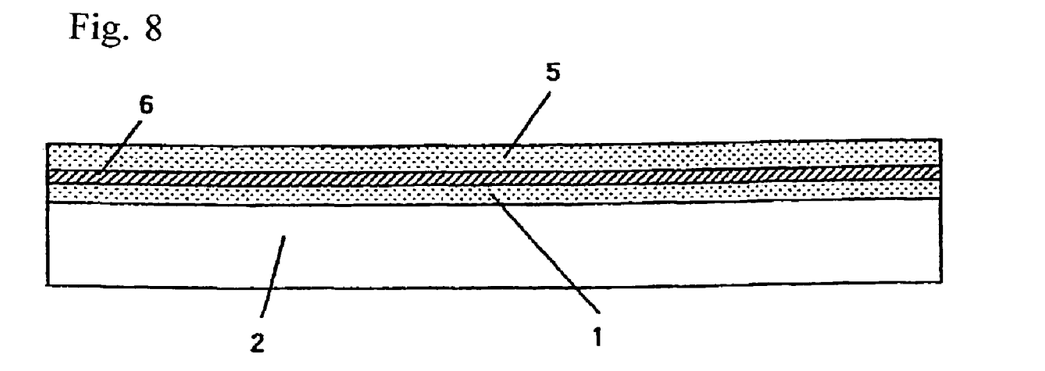
FIG. 8 is a view showing an example of a circuit forming step in a third embodiment according to this invention (step of laminating a wiring copper foil on a semiconductor wafer).

At first, a wiring-forming metal laminate is laminated to the semiconductor wafer formed at the surface thereof with circuit elements on the electrode forming surface side (FIG. 8). For the wiring-forming metal laminate, a metal laminate comprising, for example, a bump-forming copper or solder foil (10 to 100 μm thickness)/etching stopper layer nickel (0.5 to 3 μm thickness in a case of plating and 1 to 10 μm thickness in a case of foil)/wiring copper foil (1 to 100 μm).

Lamination can be conducted in the same manner as described for the portion of the first embodiment and the second embodiment of this invention.

After the lamination, resist is coated on the metal laminate and then exposure and development are conducted to form a bump-forming resist pattern.

Figure 9:
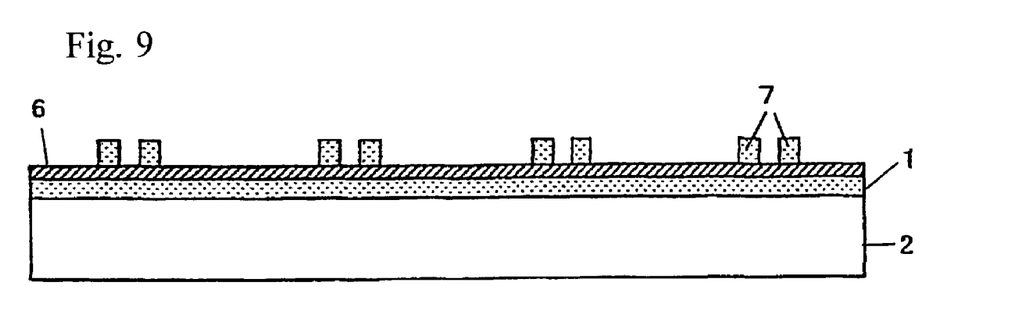
FIG. 9 is a view showing an example of a circuit forming step in the third embodiment according to this invention (forming bumps).

Then, the bump forming layer in the metal laminate is selectively etched (FIG. 9). In a case where the bump-forming layer is a copper foil, etching is conducted by using a selective copper etching solution such a commercially available alkali type copper etching solution to form bumps.

Successively, the etching stopper layer is removed.

Figure 10:
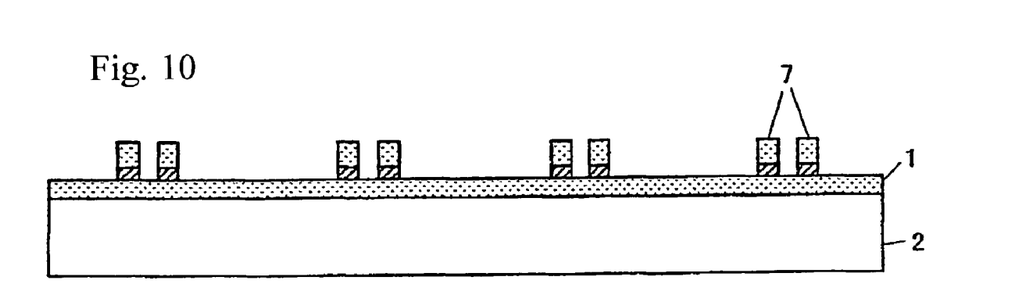
FIG. 10 is a view showing an example of a circuit forming step in the third embodiment according to this invention (selective etching of etching stopper layer nickel).

In a case where the etching stopper layer is nickel plating or foil, a commercially available nickel removing solution (for example, N-950, manufactured by Mertex Co.) can be used (FIG. 10).

Further, a wiring-forming resist wiring pattern is formed. In this case, the resist wiring pattern is preferably applied so as to indicate the boundary between each of element regions corresponding to the division into individual element regions to be described later, which is identical with that for the first embodiment and the second embodiment of this invention.

Figure 11:
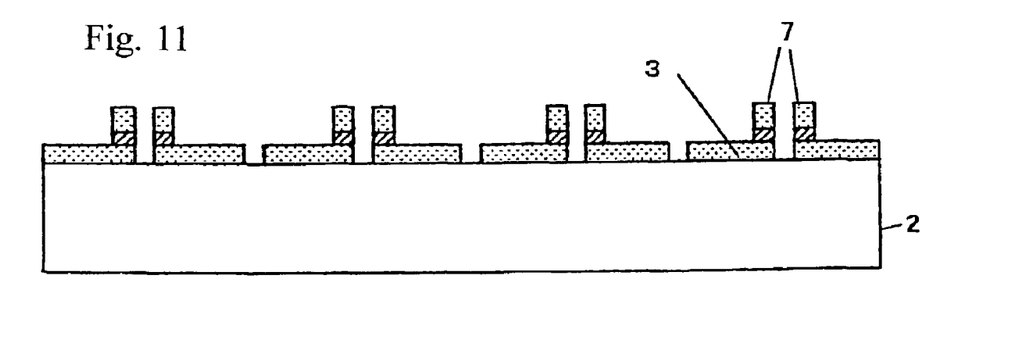
FIG. 11 is a view showing an example of a circuit forming step in the third embodiment according to this invention (selective etching of wiring-forming copper foil).

Successively, the wiring layer is etched. In a case where the wiring layer is copper, a commercially available alkali type copper etching solution or the like can be used. After forming wirings by etching, the resist is removed (FIG. 11).

Figure 12:
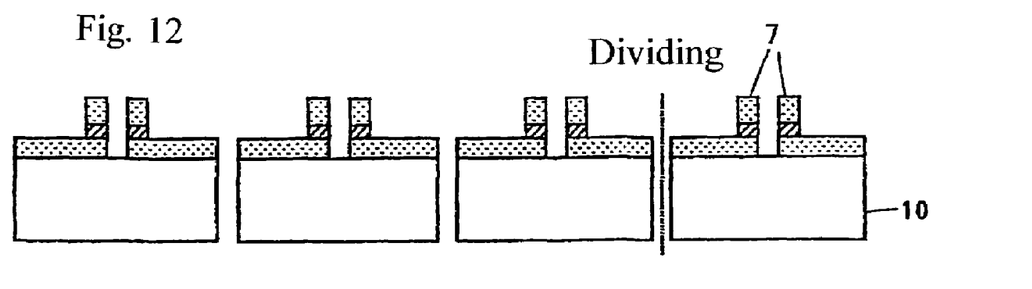
FIG. 12 is a view showing an example of a circuit forming step in the third embodiment according to this invention (step of cutting into individual elements).
Figure 13:
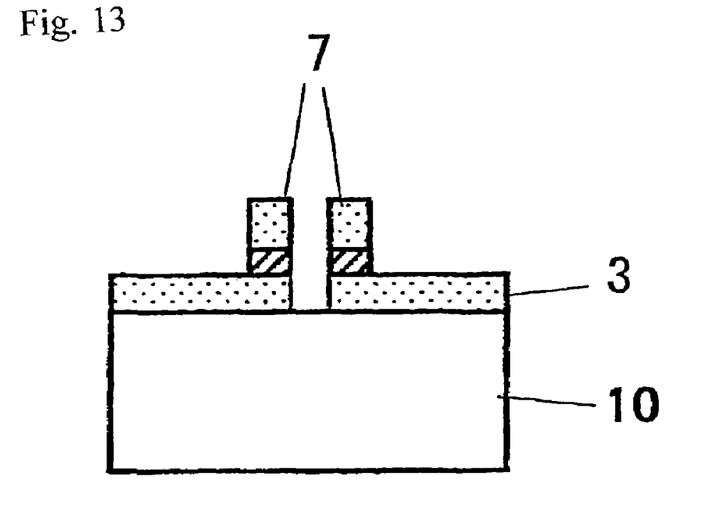
FIG. 13 is a view showing an example of a circuit forming step in the third embodiment according to this invention (element after cutting).

Finally, it is divided into individual elements (FIGS. 12, 13). Division can be conducted by the same means as in the first and the second embodiments of this invention.

EXAMPLE

Example 1

First Embodiment of this Invention (1) Material

A semiconductor wafer 1 formed at the surface thereof with circuit elements and a wiring-forming copper foil (15 μm thickness) 2 laminated by the method disclosed in International Publication WO99/58470 were used as a substrate (FIG. 1).

Before lamination, a thin metal film (nickel) was provided on the semiconductor wafer by using, for example, a sputtering method or a vapor deposition method.

(2) Formation of wirings

After coating a resist on the copper foil, exposure and development were conducted to form a resist wiring pattern. Then, copper was etched to form wirings 3 (FIG. 2).

Figure 18:
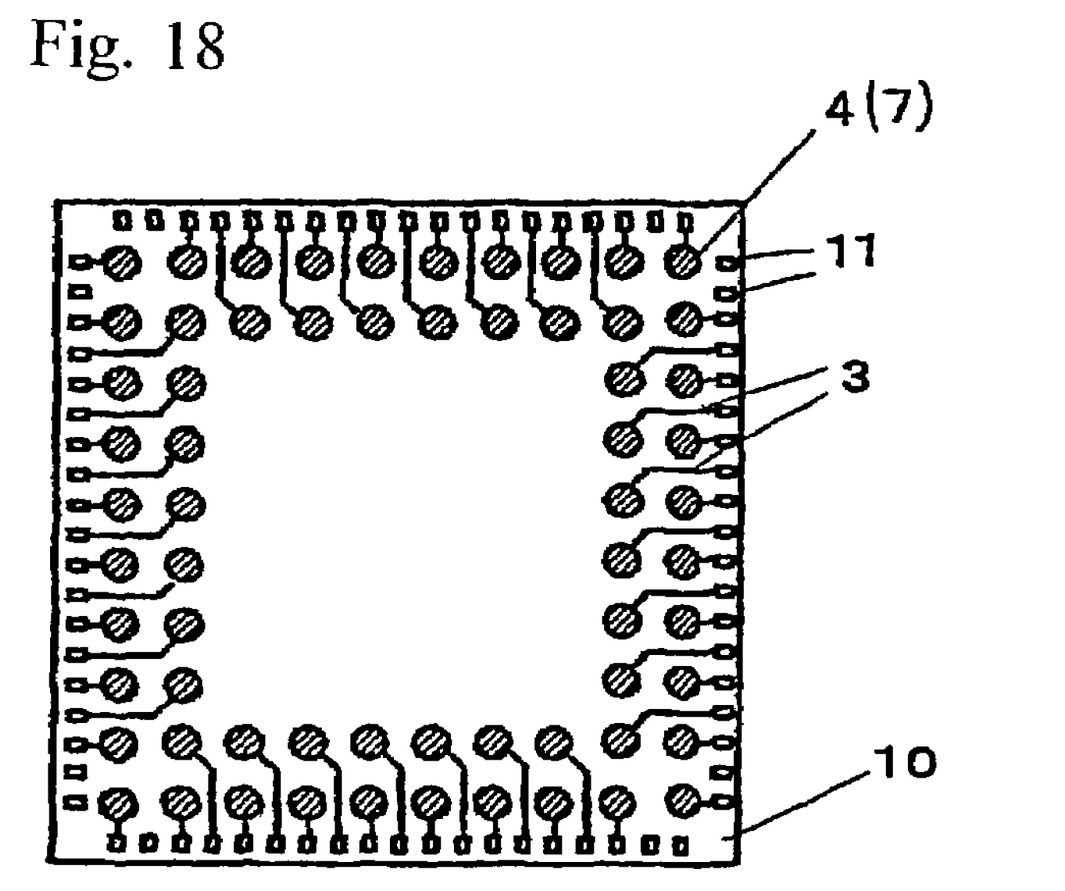
FIG. 18 is a front elevational view of an element after cutting in the first, second, third or fourth embodiment according to this invention.

(3) It was divided into individual elements (FIGS. 3, 4, 18).

Example 2

Second Embodiment of this Invention (1) Material

A semiconductor wafer 1 formed at the surface thereof with circuit elements and a wiring-forming copper foil (15 μm thickness) 2 laminated in the same manner as in Example 1 were used as a substrate (FIG. 1).

(2) Formation of wirings

After coating a resist on the copper foil, exposure and development were conducted to form a wiring-forming resist wiring pattern. Then, copper was etched to form wirings 3 (FIG. 2).

(3) Formation of solder bumps

Solder bumps 4 were formed on wirings at the positions for re-arranging electrodes (FIG. 5).

(4) It was divided into individual elements (FIGS. 6, 7, 18)

Example 3

Third Embodiment of this Invention (1) Material

A metal laminate comprising bump forming copper foil (35 μm thickness) 5/etching stopper layer nickel (plating thickness of 1 μm) 6/wiring-forming copper foil (15 μm) 1 was laminated to a semiconductor wafer formed at the surface thereof with circuit elements (identical with that used in Example 1 (FIG. 8).

(2) Pattern formation

After coating a resist on the metal laminate, exposure and development were conducted to form a bump-forming resist wiring pattern.

(3) Etching

Copper was selectively etched by using a commercially available copper etching solution such as an alkali type copper etching solution to form bumps 7 (FIG. 9).

(4) Removal of etching stopper layer

The etching stopper layer nickel 6 was removed by using a commercially available nickel removing solution (N-950, manufactured by Mertex Co.) (FIG. 10)

(5) A wiring-forming resist wiring pattern was formed.

(6) Etching was conducted by using a copper etching solution such as an alkali type copper etching solution to form wirings 3 and then the resist was removed (FIG. 11).

(7) It was divided into individual elements (FIGS. 12, 13, 18).

Example 4

Fourth Embodiment of this Invention (1) Material

A metal laminate comprising bump forming copper foil (35 μm thickness) 5/etching stopper layer nickel (plating thickness 1 μm) 6/wiring-forming copper foil (15 μm) 1 was laminated to a semiconductor wafer formed at the surface thereof with circuit elements (identical with that used in Example 1 (FIG. 8).

(2) Pattern formation

After coating a resist on the metal laminate, exposure and development were conducted to form a bump-forming resist wiring pattern.

(3) Etching

Copper was selectively etched by using a commercially available copper etching solution such as an alkali type copper etching solution to form bumps 7 (FIG. 9).

(4) Removal of etching stopper layer

The etching stopper layer nickel 6 was removed by using a commercially available nickel removing solution (N-950, manufactured by Mertex Co.) (FIG. 10)

(5) A wiring-forming resist wiring pattern was formed.

(6) Etching was conducted by using a copper etching solution such as an alkali type copper etching solution to form wirings 3 and then the resist was removed (FIG. 11).

Figure 14:
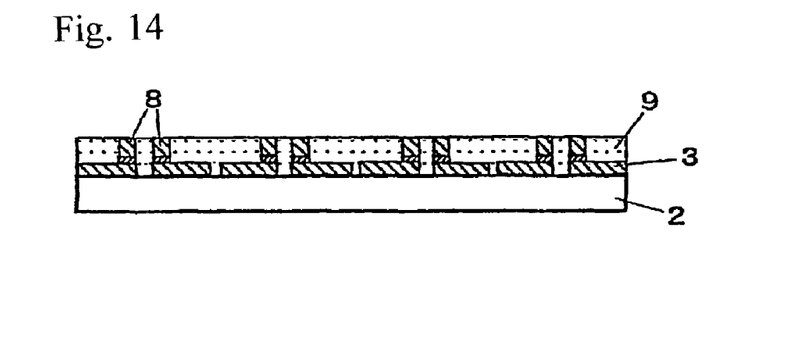
FIG. 14 is a view showing a step of coating an insulative resin and surface polishing in a fourth embodiment according to this invention.

(7) An insulative resin such as a polyimide is coated entirely on the semiconductor wafer to apply resin encapsulation. Subsequently, polishing is conducted so as to expose copper bumps to the surface (FIG. 14).

Figure 15:
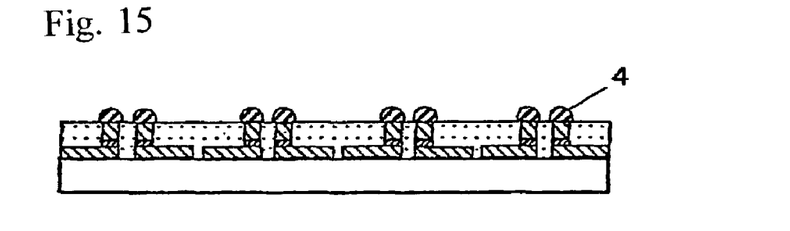
FIG. 15 is a view showing a step of forming solder bumps in the fourth embodiment according to this invention.

(8) Solder bumps are formed by using a printing method or the like (FIG. 15)

Figure 16:
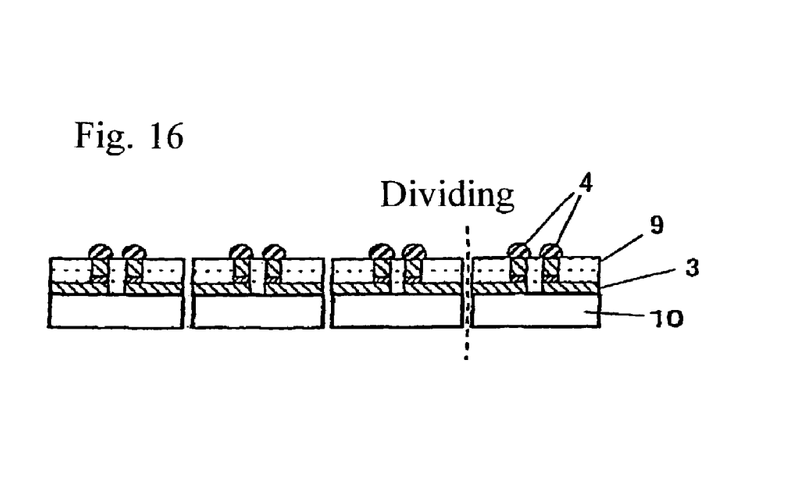
FIG. 16 is a view showing a step of cutting into individual elements in the fourth embodiment according to this invention.
Figure 17:
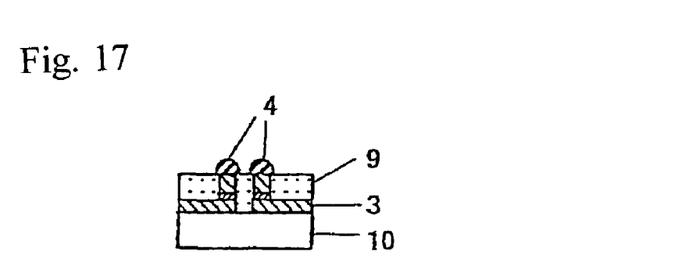
FIG. 17 is a view showing an element after cutting in the fourth embodiment according to this invention.

(9) It was divided into individual elements (FIGS. 16, 17, 18).

INDUSTRIAL APPLICABILITY

According to this invention, a chip-size package in which an electrode pitch is expanded by forming conductor wirings to a semiconductor on the electrode forming surface side can be fabricated efficiently and at a reduced cost. Particularly, wirings and bumps can be formed easily.

Accordingly, the semiconductor device and the wiring forming method according to this invention are useful in the field of semiconductors.

The invention claimed is:

1. A method of fabricating a semiconductor device including a step of laminating a wiring-forming multi-layered metal foil consisting of three layer of metal foil/etching stopper foil/metal foil to a semiconductor wafer formed at the surface thereof with circuit elements on the electrode forming surface side, a step of forming a bump-forming resist wiring pattern on the multi-layered metal foil, a step of selectively etching the metal foil, a step of removing the etching stopper layer, a step of forming a wiring-forming resist wiring pattern and a step of forming wirings by etching, a step of coating an insulative resin onto the wafer and polishing the surface of the insulative resin, a step of forming solder bumps, and a step of dividing into individual elements.

* * * * *